(12) United States Patent
Shimomura et al.

(10) Patent No.: US 12,073,867 B2
(45) Date of Patent: *Aug. 27, 2024

(54) MEMORY DEVICE

(71) Applicant: Taiwan Semiconductor Manufacturing Company, Ltd., Hsinchu (TW)

(72) Inventors: Shigeki Shimomura, Cupertino, CA (US); Jonathan Tsung-Yung Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/178,934

(22) Filed: Mar. 6, 2023

(65) Prior Publication Data

US 2023/0206983 A1 Jun. 29, 2023

Related U.S. Application Data

(63) Continuation of application No. 17/332,414, filed on May 27, 2021, now Pat. No. 11,600,317.

(51) Int. Cl.
| | |
|---|---|
| G11C 11/4074 | (2006.01) |
| G11C 5/06 | (2006.01) |
| G11C 11/408 | (2006.01) |
| G11C 11/4094 | (2006.01) |
| H03K 19/017 | (2006.01) |

(52) U.S. Cl.
CPC ............ *G11C 11/4074* (2013.01); *G11C 5/06* (2013.01); *G11C 11/4085* (2013.01); *G11C 11/4094* (2013.01); *H03K 19/01742* (2013.01)

(58) Field of Classification Search
CPC ... G11C 11/4074; G11C 5/06; G11C 11/4085; G11C 11/4094; H03K 19/01742
USPC .......................................................... 365/226
See application file for complete search history.

(56) References Cited

U.S. PATENT DOCUMENTS

| | | | |
|---|---|---|---|
| 6,515,893 B1* | 2/2003 | Bhavnagarwala | .... G11C 11/412 365/189.09 |
| 8,379,436 B2 | 2/2013 | Kawasumi | |
| 9,236,116 B1 | 1/2016 | Braceras et al. | |
| 11,600,317 B2 | 3/2023 | Shimomura et al. | |
| 2013/0272076 A1 | 10/2013 | Chand Sk et al. | |

* cited by examiner

*Primary Examiner* — Huan Hoang
(74) *Attorney, Agent, or Firm* — Merchant & Gould P.C.

(57) ABSTRACT

A memory device is provided. The memory device includes a bit cell having a first invertor connected between a first node and a second node and a second invertor connected between the first node and the second node. The first invertor and the second invertor are cross coupled at a first data node and a second data node. The memory device further includes a pull down circuit connected to the second node. The pull down circuit is operative to pull down a voltage of the second node below a ground voltage in response to an enable signal.

20 Claims, 13 Drawing Sheets

MEMORY DEVICE

CROSS-REFERENCE

This application is a continuation of U.S. patent application Ser. No. 17/332,414 filed May 27, 2021, the disclosure of which is hereby incorporated herein by reference in its entirety.

BACKGROUND

A common type of integrated circuit memory is a static random access memory (SRAM) device. A typical SRAM memory device includes an array of bit cells, with each bit cell having six transistors connected between an upper reference potential and a lower reference potential. Each bit cell has two storage nodes where information may be stored. The first node stores the desired information, while the complementary information is stored at the second storage node. SRAM cells have the advantageous feature of holding data without requiring a refresh.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
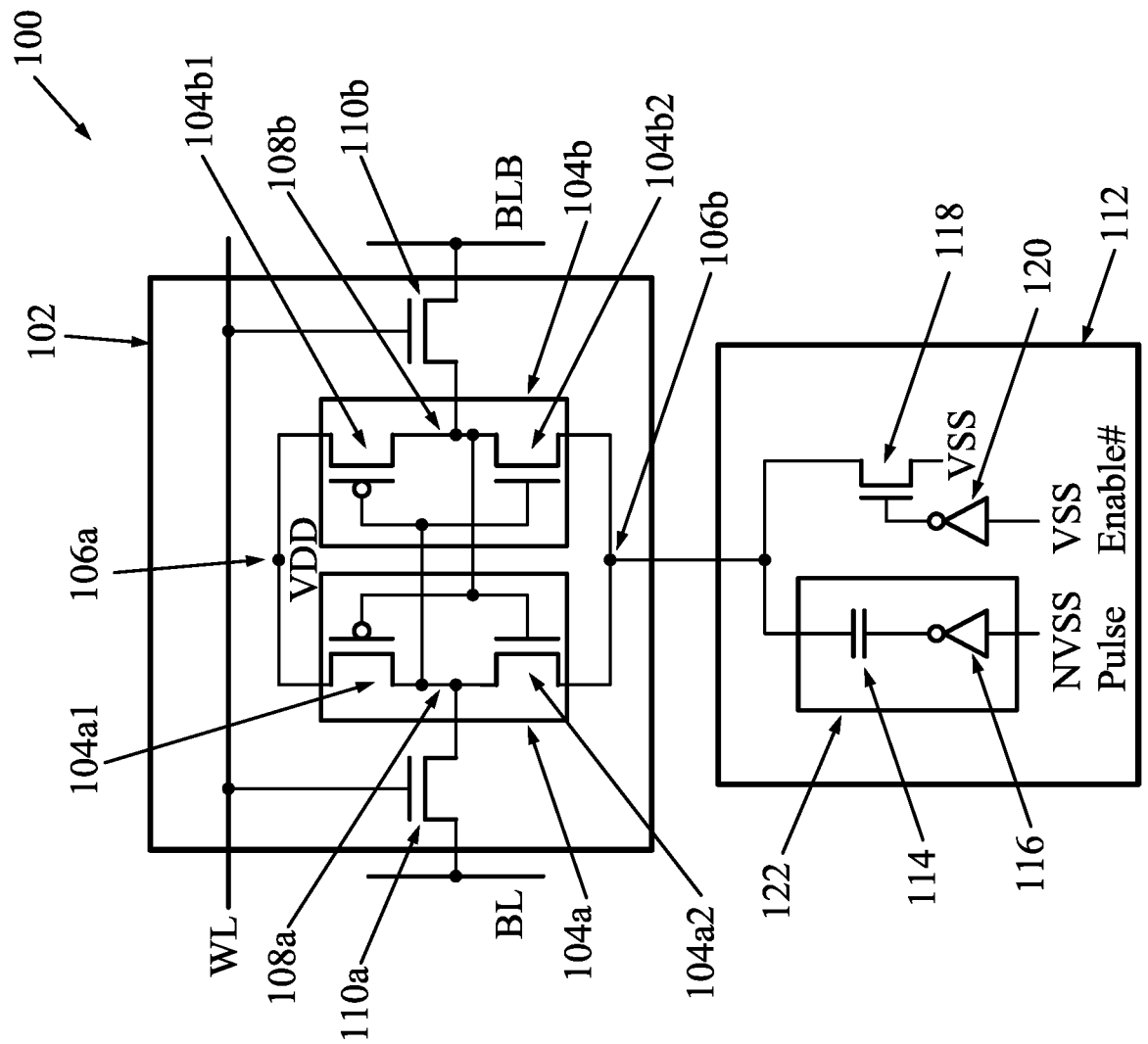
FIG. 1A is a diagram illustrating an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides processes to improve a memory device, for example, a Static Random Access Memory (SRAM), operation by providing a pull down circuit. The pull down circuit pulls down a voltage of a ground voltage node (also referred to as VSS node) of the memory device below a ground voltage through capacitive coupling.

FIG. 1A is a diagram illustrating a memory device 100 in accordance with example embodiments. As shown in FIG. 1A, memory device 100 includes a memory cell 102. Memory cell 102 is a SRAM device having six transistors (also referred to as 6T SRAM). Memory cell 102 includes a first invertor 104a and a second inverter 104b (collectively referred to as inverters 104). A first end of first invertor 104a is connected to a first node 106a (also referred to as a supply node or a VDD node). A second end of first invertor 104a is connected to a second node 106b (also referred to as a ground voltage node or a VSS node).

Memory cell 102 includes a first data node 108a and a second data node 108b. First invertor 104a and second invertor 104b are cross coupled to each other at first data node 108a and second data node 108b. First data node 108a is complementary to second data node 108b. Each of first data node 108a and second data node 108b stores one bit of information (that is, bit "0" or "1").

First invertor 104a includes a first invertor first transistor 104a1 and a first invertor second transistor 104a2. A source of first invertor first transistor 104a1 is connected to first node 106a and a drain of first invertor first transistor 104a1 is connected to first data node 108a. A source of first invertor second transistor 104a2 is connected to first data node 108a and a drain of first invertor second transistor 104a2 is connected to second node 106b. A gate of each of first invertor first transistor 104a1 and first invertor second transistor 104a2 is connected to second data node 108b thereby cross-coupling first invertor 104a with second invertor 104b. In some examples, first invertor first transistor 104a1 is also referred to as a first pull-up transistor and a first invertor second transistor 104a2 is also referred to as a first pull-down transistor.

In examples, first invertor first transistor 104a1 is a p-channel Metal Oxide Semiconductor (pMOS) transistor and first invertor second transistor 104a2 is an n-channel Metal Oxide Semiconductor (nMOS) transistor. However, it will be apparent to a person with an ordinary skill in the art after reading this disclosure that other types of transistors, such as, a Metal Oxide Semiconductor Field Effect Transistor (MOSFET), an nMOS transistor, a pMOS transistor, or a Complementary metal oxide semiconductor (CMOS) transistor can be used for each of first invertor first transistor 104a1 and first invertor second transistor 104a2. In addition, each of first invertor first transistor 104a1 and first invertor second transistor 104a2 is symmetrical. That is, a source of each of first invertor first transistor 104a1 and first invertor second transistor 104a2 can be a drain, and a drain can be a source.

Second invertor 104b includes a second invertor first transistor 104b1 and a second invertor second transistor 104b2. A source of second invertor first transistor 104b1 is connected to first node 106a and a drain of second invertor first transistor 104b1 is connected to second data node 108b. A source of second invertor second transistor 104b2 is connected to second data node 108b and a drain of second invertor second transistor 104b2 is connected to second node 106b. A gate of each of second invertor first transistor 104b1 and second invertor second transistor 104b2 is connected to first data node 108a thereby cross-coupling second invertor 104b with first invertor 104a.

In examples, second invertor first transistor 104b1 is a pMOS transistor and second invertor second transistor 104b2 is an nMOS transistor. However, it will be apparent to a person with an ordinary skill in art after reading this disclosure that other types of transistors, such as, a MOSFET, an nMOS transistor, a pMOS transistor, or a CMOS transistor can be used for each of second invertor first transistor 104b1 and second invertor second transistor 104b2. In addition, each of second invertor first transistor 104b1 and second invertor second transistor 104b2 are symmetrical. That is, a source of each of second invertor first transistor 104b1 and second invertor second transistor 104b2 can be a drain, and a drain can be a source. In some examples, second invertor first transistor 104b1 is also referred to as a second pull-up transistor and a second invertor second transistor 104b2 is also referred to as a second pull-down transistor.

Memory cell 102 further includes a third transistor 110a and a fourth transistor 110b. A source of third transistor 110a is connected to a Bit Line (BL) and a drain of third transistor 110a is connected to first data node 108a. A gate of third transistor 110a is connected to a Word Line (WL). A source of fourth transistor 110b is connected to a BL Bar (BLB) and a drain of fourth transistor 110b is connected to second data node 108b. A gate of fourth transistor 110b is connected to the WL. In some examples, third transistor 110a and fourth transistor 110b are also referred to as Pass Gate (PG) transistors. In examples, the BLB is complementary to the BL and is also referred to as a complementary BL.

In examples, each of third transistor 110a and fourth transistor 104b2 are an nMOS transistor. However, it will be apparent to a person with an ordinary skill in art after reading this disclosure that other types of transistors, such as, a MOSFET, a pMOS transistor, or a CMOS transistor can be used for each of third transistor 110a and fourth transistor 110b. In addition, each of third transistor 110a and fourth transistor 110b are symmetrical. That is, a source of each of third transistor 110a and fourth transistor 110b can be a drain, and a drain can be a source.

During a read or a write operation on memory cell 102, the WL is charged to a logic high in response to a read enable signal or a write enable signal. Charging of the WL to a logic high causes first data node 108a to be connected to the BL and second data node 108b to be connected to the BLB.

Continuing with FIG. 1A, memory device 100 further includes a pull down circuit 112. Pull down circuit 112 is connected to second node 106b (or the ground voltage node) of memory cell 102 and is operative to pull down a voltage of second node 106b to a negative value during a read operation and a write operation.

As shown in FIG. 1A, pull down circuit 112 includes a pull down circuit capacitor 114, a pull down circuit first invertor 116, a pull down circuit transistor 118, and a pull down circuit second invertor 120. A first end of pull down circuit capacitor 114 is connected to second node 106b (that is, the ground voltage node or the VSS node) of memory cell 102. A second end of capacitor 114 is connected to an output of pull down circuit first invertor 116. Pull down circuit first invertor 116 is operative to receive a Negative VSS (NVSS) pulse signal at its input. A voltage level of the NVSS is approximately equal to the VDD. In example embodiments, pull down circuit capacitor 114 and pull down circuit first invertor 116 together are also referred to as a negative voltage generator circuit 122.

A source of pull down circuit transistor 118 is connected to second node 106b (that is, the ground voltage node) and a drain of pull down circuit transistor 118 is connected to the ground. A gate of pull down circuit transistor 118 is connected to an output of pull down circuit second invertor 120. An input of pull down circuit second invertor 120 is operative to receive an enable signal or a VSS enable signal.

In examples, pull down circuit transistor 118 is an nMOS transistor. However, it will be apparent to a person with an ordinary skill in art after reading this disclosure that other types of transistors, such as, a MOSFET, a pMOS transistor, or a CMOS transistor can be used for pull down circuit transistor 118. In addition, pull down circuit transistor 118 is symmetrical. That is, a source of pull down circuit transistor 118 can be a drain, and a drain can be a source.

Figure 1B:
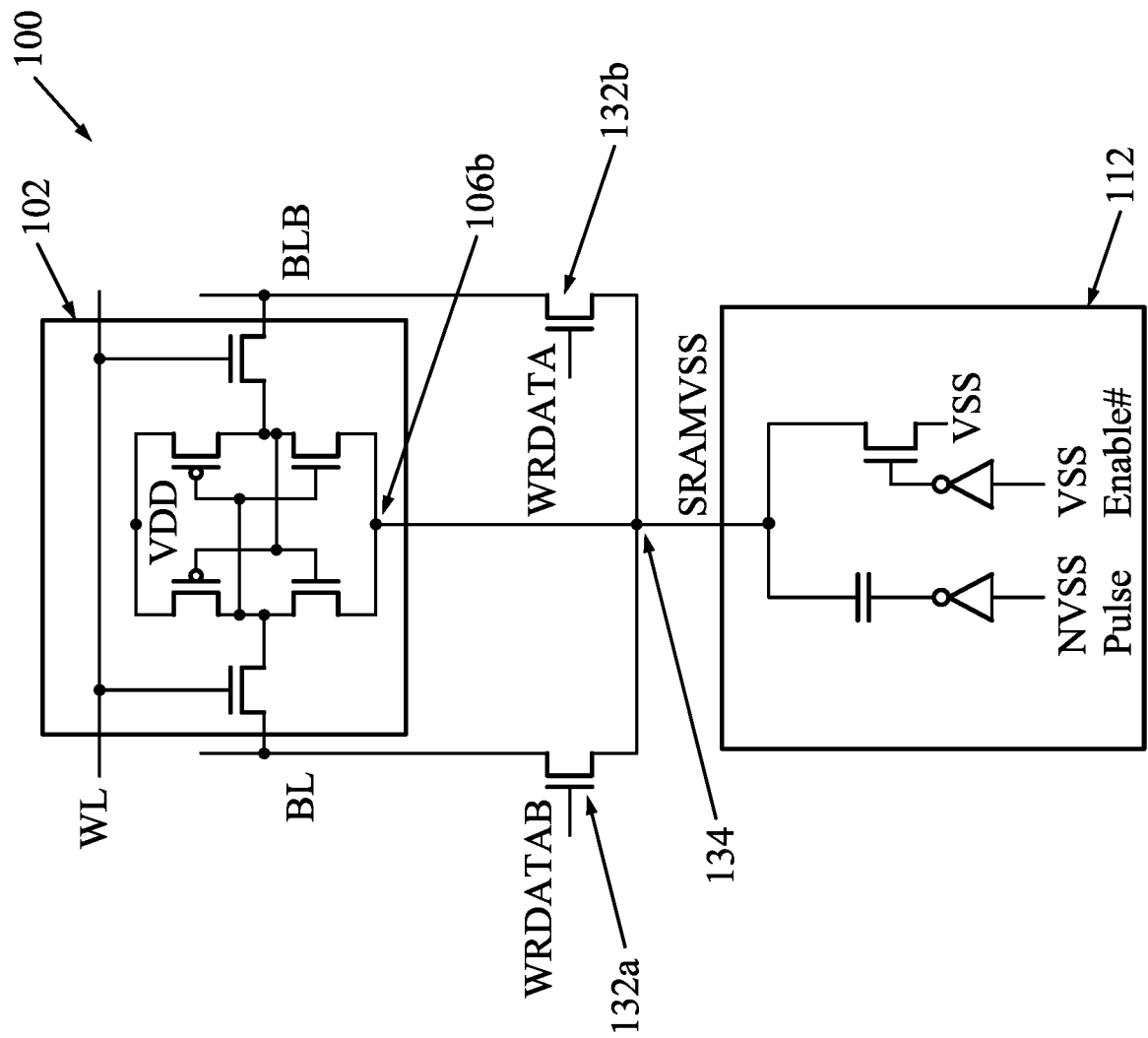
FIG. 1B is a diagram illustrating an example memory device with a write driver in accordance with some embodiments.

FIG. 1B is another diagram illustrating a memory device 100 with a write driver in accordance with example embodiments. As shown in FIG. 1B, memory device 130 includes memory cell 102 and pull down circuit 112. Pull down circuit 112 is connected to second node 106b (that is, the ground voltage node) of memory cell 102. Memory device 100 further includes a write driver first transistor 132a and a write driver second transistor 132b. Write driver first transistor 132a and write driver second transistor 132b together are also referred to as a write driver. Pull down circuit 112 is connected to a write driver ground voltage node 134. Because pull down circuit 112 is connected to write driver ground voltage node 134, during a write operation, a voltage level of write drive ground voltage node 134 and second node 106b is pulled down to a negative value thereby increasing a write efficiency of memory device 100.

A source of write driver first transistor 132a is connected to the BL and a drain of write driver first transistor 132a is connected to write driver ground voltage node 134. A gate of write driver first transistor 132a is connected to a write data bar (WRDATAB) signal. A source of write driver second transistor 132b is connected to the BLB and a drain of write driver second transistor 132b is connected to write driver ground voltage node 134. A gate of write driver second transistor 132b is connected to a write data (WR-DATA) signal.

In examples, write driver first transistor 132a and write driver second transistor 132b are nMOS transistors. However, it will be apparent to a person with an ordinary skill in art after reading this disclosure that other types of transistors, such as, a MOSFET, a pMOS transistor, or a CMOS transistor can be used for each of write driver first transistor 132a and write driver second transistor 132b. In addition, each of write driver first transistor 132a and write driver second transistor 132b are symmetrical. That is, a source of each of write driver first transistor 132a and write driver second transistor 132b can be a drain, and a drain can be a source.

Figure 2A:
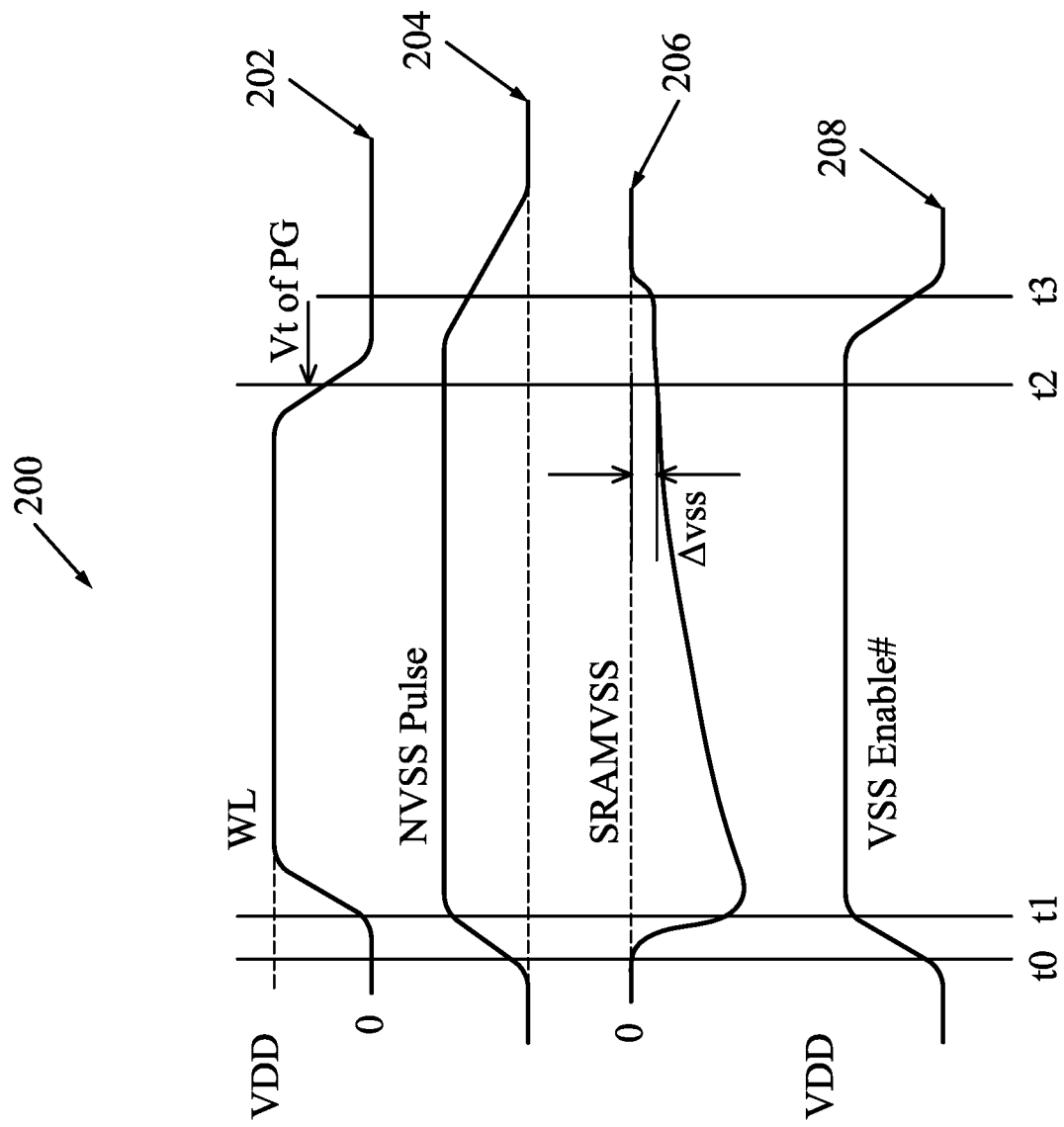
FIG. 2A is graph illustrating voltages for different components of a memory device during a read operation in accordance with some embodiments.

In example embodiments, the enable signal is generated in response to a read operation or a write operation on memory device 100. FIG. 2A illustrates example voltage profiles of different components of memory device 100 during a read operation. For example, first plot 202 of FIG. 2A illustrates an example voltage profile of the WL. Second plot 204 of FIG. 2A illustrates an example voltage profile of the NVSS pulse signal. Third plot 206 of FIG. 2A illustrates an example voltage profile of second node 106b (that is, the ground voltage node or the VSS node). Fourth plot 208 of FIG. 2A illustrates an example voltage profile of the enable signal.

As shown in first plot 202 of FIG. 2A, the WL is charged to a logic high. In example embodiments, the WL is charged to a logic high (that is, asserted) to initiate a read operation on memory cell 102. The WL is charged to a logic high at a time t1. In example embodiments, a voltage corresponding to a logic high is approximately equal to the VDD of memory cell 102 and a voltage corresponding to a logic low is approximately equal to the ground voltage or zero volt.

In addition, and as shown in second plot 204, the NVSS pulse signal is charged to a logic high. As shown in FIG. 2A, the NVSS pulse signal is charged to the logic high slightly before the WL being charged to a logic high (that is, at time t0). In example embodiments, the NVSS pulse signal is charged coincidentally with the WL or slightly before the WL being charged to a logic high. The charging of the NVSS pulse signal to a logic high results in the output of pull down circuit first invertor 116 to be charged to a logic low and coupling of pull down circuit capacitor 114 to the ground voltage node of memory device 100.

Moreover, and as shown in fourth plot 208, the enable signal is charged to a logic high for the read or write operation on memory cell 102. The enable signal is charged to the logic high slightly before (that is, at time t0) or coincidentally with the WL being charged to a logic high.

In example embodiments, when the enable signal is charged to a logic high, the output of pull down circuit second invertor 120 is at logic low and by extension the gate of pull down circuit transistor 118 to be at a logic low. This results pull down circuit transistor 118 being switched off thereby disconnecting the ground voltage node of memory cell 102 from the ground.

In addition, and as shown in third plot 206 of FIG. 2A, a voltage of the ground voltage node of memory cell 102 is pulled to a logic low as a result of coupling of pull down circuit capacitor 114 to the ground voltage node. The voltage of the ground voltage node of memory cell 102 however may continue to be gradually pulled back as the ground voltage node sinks read current for memory cell 102.

As shown first plot 202, the WL is de-asserted after a predetermined duration from its assertion. In example embodiments, the predetermined duration is less than a time when the voltage of the ground voltage node reaches zero volts. After the WL is deasserted, the voltage on the WL starts to drop and reaches a Vt level of third transistor 110a or fourth transistor 110b at time t2. At time t2, when the WL drops below the Vt level of third transistor 110a or fourth transistor 110b, third transistor 110a or fourth transistor 110b stop drawing a cell current. In addition, third transistor 110a or fourth transistor 110b draws more $I_{DS}$ than before the WL is de-asserted. As shown in third plot 206, the voltage of the ground voltage node at time t2 is AVSS below zero volt (that is, negative ΔVSS). The ΔVSS improves memory device 100 stability due to a larger voltage difference (that is (VDD+ AVSS-VDD) compared to (VDD-VSS)) between first node 106a (that is, the power supply node) and second node 106b (that is, the ground voltage node) during the read operation.

In example embodiments, the forward bias current is increased as the voltage of the ground voltage node being pulled down below zero volt. FIG. 2C illustrates plots 250 comparing the forward bias current of memory cell 102. For example, a first plot 252 of FIG. 2C illustrates the forward bias current of memory cell 102 with pull down circuit 112 connected to the ground voltage node of memory cell 102. Second plot 254 illustrates the forward bias current without pull down circuit 112 connected to the ground voltage node of memory cell 102. As shown in plots 250, the forward bias current for memory cell 102 is higher when pull down circuit 112 connected to the ground voltage node. The difference in the forward bias current is approximately equal to AVSS.

Referring back to FIG. 2A, as shown in fourth plot 208, after end of the read or write operation, the enable signal is re-asserted (that is charged to logic low) at time t3. Re-asserting the enable signal causes the output of pull down circuit second invertor 120 to rise to a logic high which results in switching on of pull down circuit transistor 118. Switching on of pull down circuit transistor 118 causes the ground voltage node of memory cell 102 to be connected to the ground. In addition, and as shown in second plot 204, the NVSS pulse signal is slowly de-asserted after the end of the read or write operation.

Figure 2B:
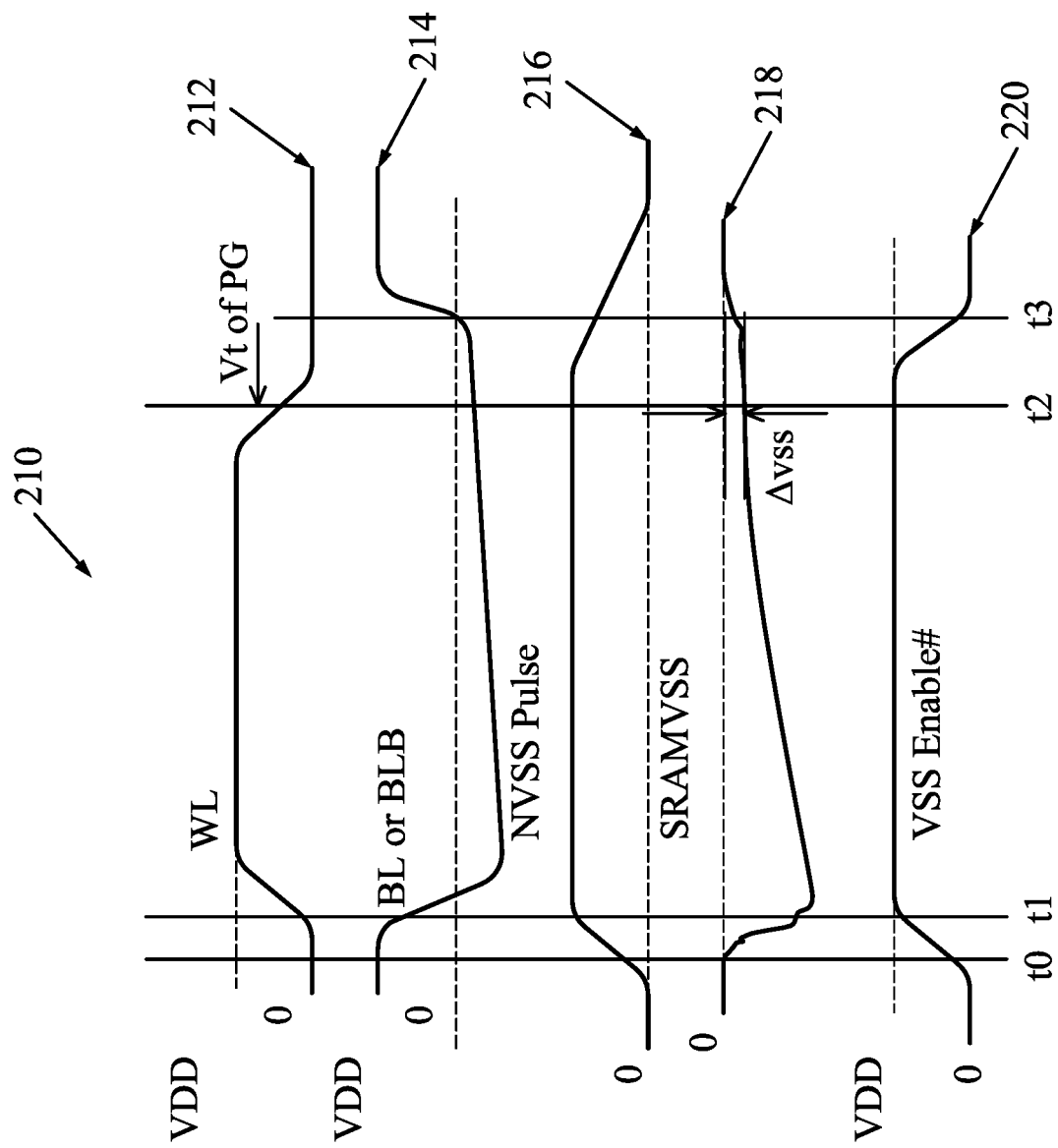
FIG. 2B is graph illustrating voltages for different components of a memory device during a write operation in accordance with some embodiments.
Figure 2C:
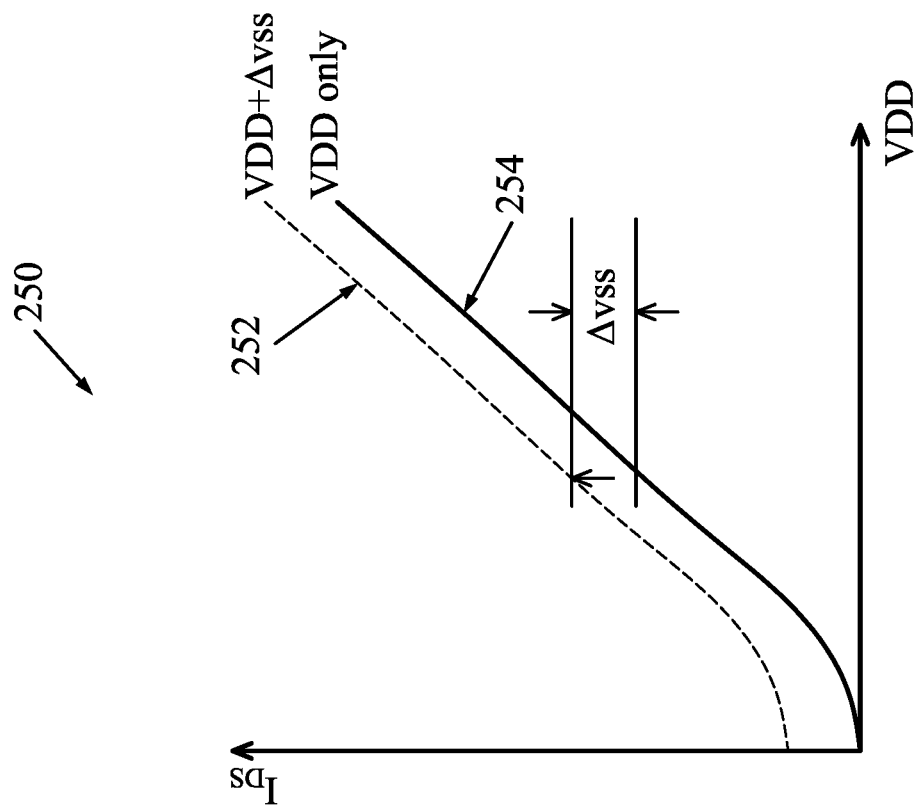
FIG. 2C is graph illustrating forward currents of a memory device in accordance with some embodiments.

FIG. 2B illustrates example voltage profiles of different components of memory device 100 during a write operation. For example, first plot 212 of FIG. 2B illustrates an example voltage profile of the WL. Second plot 214 of FIG. 2B illustrates an example voltage profile of the BL or the BLB. Third plot 216 of FIG. 2B illustrates an example voltage profile of the NVSS pulse signal. Fourth plot 218 of FIG. 2B illustrates an example voltage profile of second node 106b (that is, the ground voltage node). Fifth plot 220 of FIG. 2B illustrates an example voltage profile of the enable signal.

As shown in first plot 212 of FIG. 2B, the WL is charged to a logic high for the write operation on memory cell 102. The WL is charged to a logic high at a time t1. In addition, and as shown in second plot 214, the BL or the BLB is charged to a logic low at tine t1. Moreover, and as shown in third plot 216, the NVSS pulse signal is charged to a logic high. The NVSS pulse signal is charged to the logic high slightly before the WL being charged to a logic high (that is, at time t0). In example embodiments, the NVSS pulse signal is charged coincidentally with the WL or slightly before the WL being charged to a logic high. The charging of the NVSS pulse signal to a logic high results in the output of pull down circuit first invertor 116 to be charged to a logic low and coupling of pull down circuit capacitor 114 to the ground voltage node of memory device 100 and write driver ground voltage node 134 of the write driver.

As shown in fifth plot 220, the enable signal is charged to a logic high for the write operation on memory cell 102. The enable signal is charged to the logic high slightly before (that is, at time t0) or coincidentally with the WL being charged to a logic high.

In example embodiments, when the enable signal is charged to a logic high, the output of pull down circuit second invertor 120 is at logic low and by extension the gate of pull down circuit transistor 118 to be at a logic low. This results pull down circuit transistor 118 being switched off thereby disconnecting the ground voltage node of memory cell 102 from the ground.

In addition, and as shown in fourth plot 218 of FIG. 2B, a voltage of the ground voltage node of memory cell 102 and write driver ground voltage node 134 is pulled to a logic low as a result of coupling of pull down circuit capacitor 114 to the ground voltage node. The voltage of the ground voltage node of memory cell 102 however may continue to be gradually pulled back as the ground voltage node sinks read current for memory cell 102.

As shown first plot 212, the WL is de-asserted after a predetermined duration from its assertion. The predetermined duration, in some examples, is less than a time when the voltage of the ground voltage node reaches zero volts. After the WL is de-asserted, the voltage on the WL starts to drop and reaches a Vt level of third transistor 110a or fourth transistor 110b at time t2. As shown in fourth plot 218, the voltage of the ground voltage node at time t2 is AVSS below zero volt (that is, negative ΔVSS). The ΔVSS improves memory device 100 stability due to a larger voltage difference (that is (VDD+ ΔVSS-VDD) compared to (VDD-VSS)) between first node 106a (that is, the power supply node) and the ground voltage node during the read operation.

Figure 3:
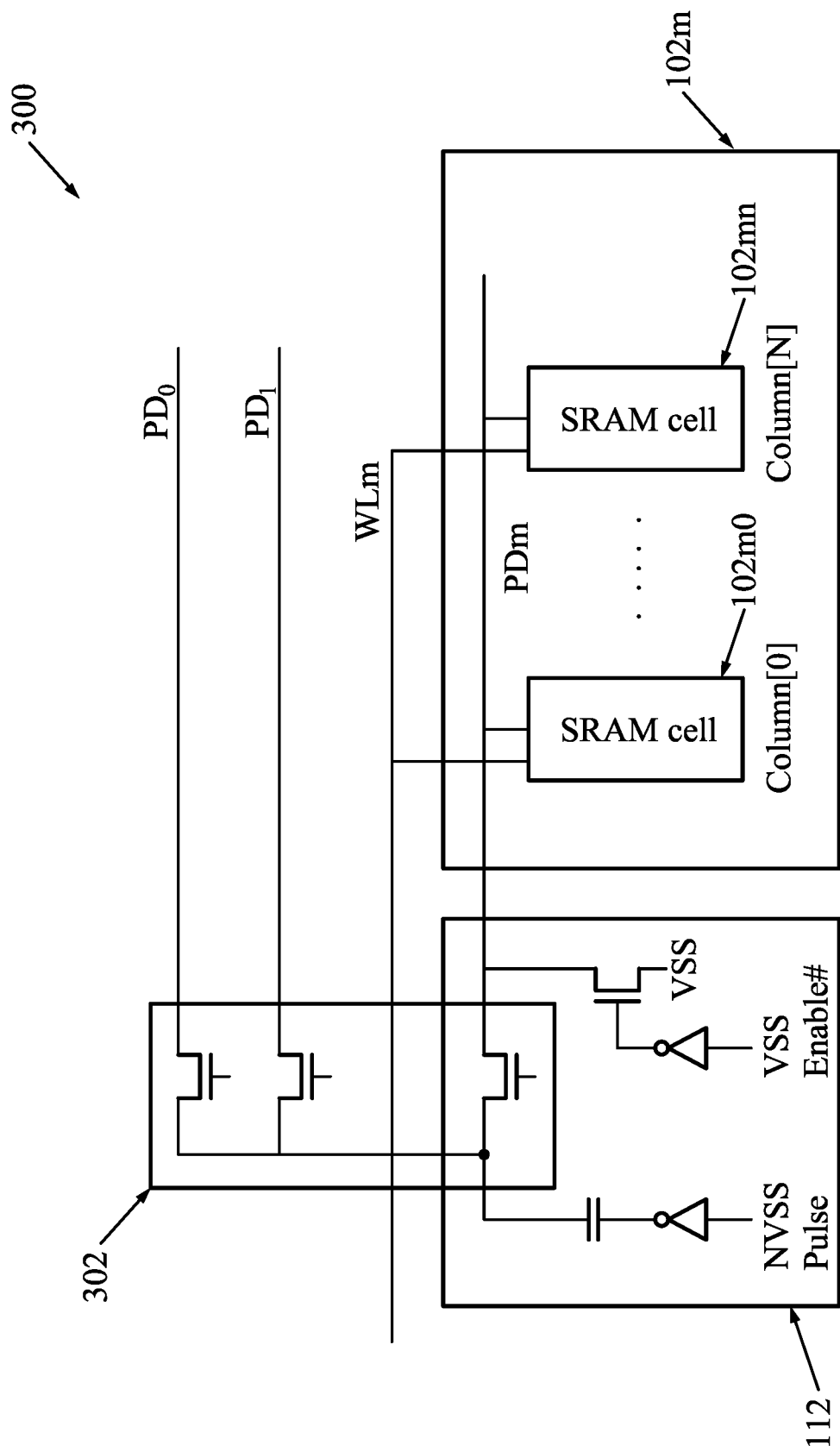
FIG. 3 is a diagram illustrating another example memory device in accordance with some embodiments.

In example embodiments, pull down circuit 112 can be shared by multiple memory cells. FIG. 3 illustrates a memory device 300 where pull down circuit 112 is shared by a plurality of memory cells. Memory device 300 of FIG. 3 includes a plurality of memory cells arranged in a matrix having a plurality of rows (for example, m rows) and a plurality of columns (for example, n columns). Each of the plurality of columns includes a first plurality of memory cells and each of the plurality of rows includes a second plurality of memory cells.

In addition, memory device 300 includes a plurality of word lines, a plurality of bit lines, and a plurality of complementary bit line (also referred to as bit line bars). Each of the first plurality of memory cells of a column of the plurality of columns is connected to a bit line of the plurality of bit lines and a bit line bar of the plurality of bit line bars. Moreover, each of the second plurality of memory cells of a row of the plurality of rows is connected to a word line of the plurality of word lines.

For example, each of the second plurality of memory cells (that is memory cell 102$m$0, . . . , memory cell 102$mn$, collectively referred to as $m^{th}$ second plurality of memory cells 102$m$) of a $m^{th}$ row of memory device 300 are connected to a $m^{th}$ word line (represented as $WL_m$). Similarly, second node 106$b$ of each of $m^{th}$ second plurality of memory cells 102$m$ are connected to a $m^{th}$ pull down line (represented as $PD_m$).

Continuing on, $1^{st}$ second plurality of memory cells of a $1^{st}$ row of memory device 300 are connected to a $1^{st}$ word line and second node 106$b$ of each of the $1^{st}$ second plurality of memory cells are connected to a $1^{st}$ pull down line (represented as $PD_1$). Moreover, $0^{th}$ second plurality of memory cells of a $0^{th}$ row of memory device 300 are connected to a $0^{th}$ word line and second node 106$b$ of each of the $0^{th}$ second plurality of memory cells are connected to a $0^{th}$ pull down line (represented as $PD_0$).

In example embodiments, each of the pull down line is parallel to and is associated with a word line associated with the corresponding second plurality of memory cells. For example, the $PD_0$ is parallel to $WL_0$. In example embodiments, the pull down line is formed in a same or a different metal layer than the word line. For example, both $PD_0$ and $WL_0$ are formed in a metal layer 3. In another example, $PD_0$ is formed in metal layer 1 while $WL_0$ is formed in a metal layer 3. In example embodiments, a pull down line is shared among multiple consecutive rows. For example, one pull down line is shared by each two consecutive rows, four consecutive rows, eight consecutive rows, etc.

Memory device 300 of FIG. 3 further includes a selector circuit 302. Selector circuit 302 is operative to connect pull down circuit 112 to a pull down line which is parallel to and is associated with a word line charged for a read or a write operation. For example, when $WL_m$ is selected for a read or a write operation on one of $m^{th}$ second plurality of memory cells 102$m$, selector circuit 302 connects pull down circuit 112 to $PD_m$.

In example embodiments, selector circuit 302 includes a plurality of selector transistor switches. Each of the plurality of selector transistor switches is associated with a pull down line and, when switched on, connects pull down circuit 112 to the pull down line. A source of each of the plurality of selector transistor switches is connected to pull down circuit 112 and a drain of each of the plurality of selector transistor switches is connected to a pull down line. A gate of each of the plurality of selector transistor switches is connected to a control circuit to switch on and switches off.

In example embodiments, and as shown in FIG. 3, the plurality of transistor switches of selector circuit 302 are nMOS transistors. However, it will be apparent to a person with an ordinary skill in art after reading this disclosure that other types of transistors, such as, a MOSFET, a pMOS transistor, or a CMOS transistor can be used for, the plurality of transistor switches of selector circuit 302. In addition, each of the plurality of transistor switches of selector circuit 302 are symmetrical. That is, a source of each of the plurality of transistor switches of selector circuit 302 can be a drain, and a drain can be a source.

Figure 4:
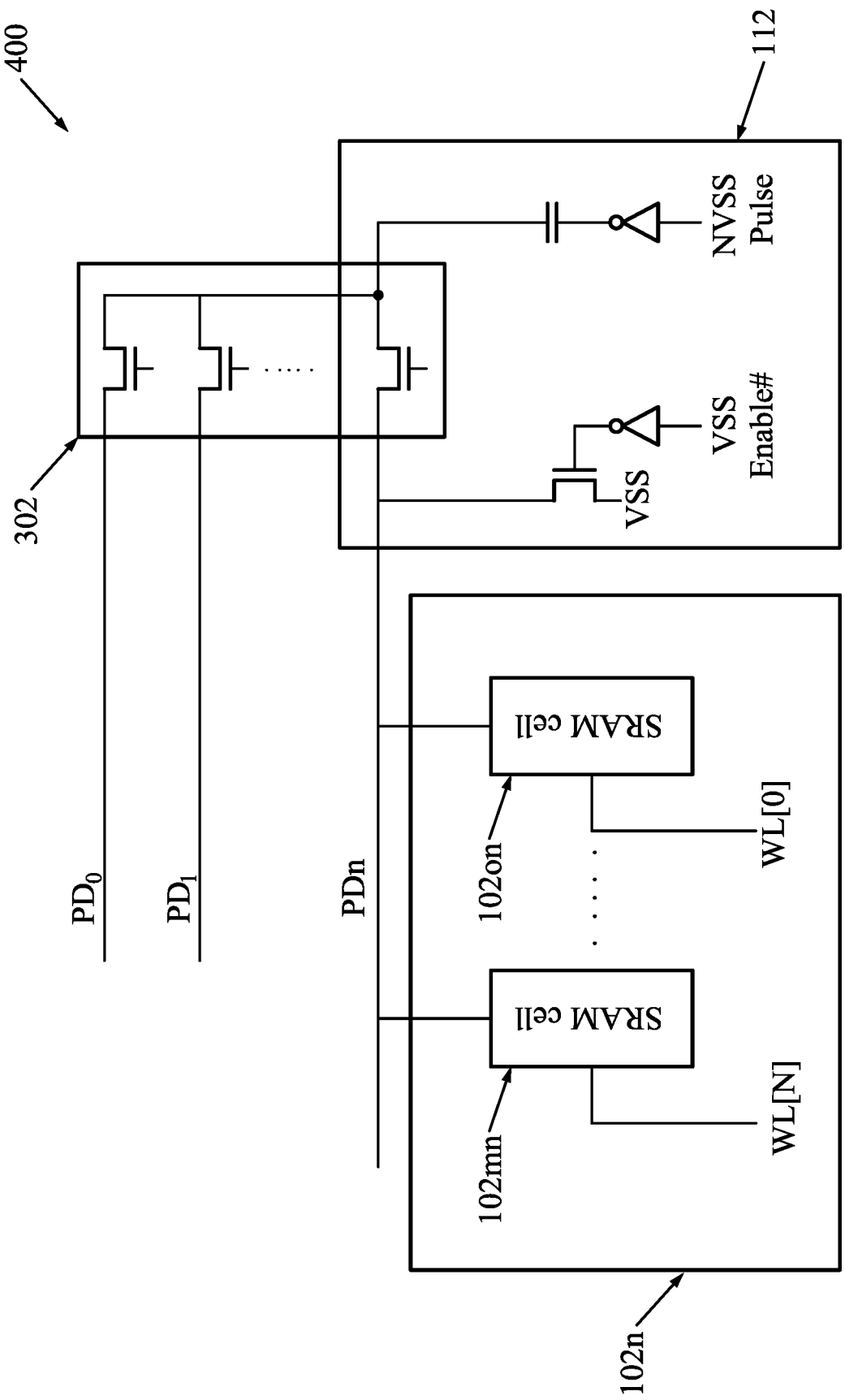
FIG. 4 is a block diagram illustrating yet another example memory device in accordance with some embodiments.

Although the pull down line are shown to be formed parallel to the word lines in FIG. 3, it will be apparent to a person with skill in the art that the pull down lines can be formed parallel to bit lines of a memory device. FIG. 4 illustrates a memory device 400 having pull down lines parallel to the bit lines.

For example, and as shown in FIG. 4, second node 106$b$ of each of $n^{th}$ first plurality of memory cells (that is, memory cell 102$on$, . . . , memory cell 102$mn$, collectively referred to as $n^{th}$ first plurality of memory cells 102$n$) of an $n^{th}$ column of memory device 400 are connected to the $n^{th}$ pull down line ($PD_n$). Continuing on, second node 106$b$ of each of the $1^{st}$ first plurality of memory cells of a $1^{st}$ column of memory device 400 are connected to a $1^{st}$ pull down line (represented as $PD_1$). Moreover, second node 106$b$ of each of the $0^{th}$ first plurality of memory cells of a $0^{th}$ row of memory device 400 are connected to a $0^{th}$ pull down line (represented as $PD_0$). In example embodiments, a pull down line is shared among multiple consecutive columns. For example, one pull down line is shared by each two consecutive columns, four consecutive columns, eight consecutive columns, etc.

Selector circuit 302 is operative to connect pull down circuit 112 to a pull down line which is parallel to and is associated with a word line charged for a read or a write operation. In example embodiments, $PD_n$ is formed parallel to an $n^{th}$ bit line or an $n^{th}$ complimentary bit line. $PD_n$ can be formed in same metal layer or a different metal layer than the $n^{th}$ bit line or the $n^{th}$ complimentary bit line. For example, $PD_n$ is formed in a metal layer 0 or a metal layer 2. In example embodiments, a pull down line is shared among multiple consecutive bit lines. For example, one pull down line is shared by each two consecutive bit lines, four consecutive bit lines, eight consecutive bit lines, etc.

Figure 5B:
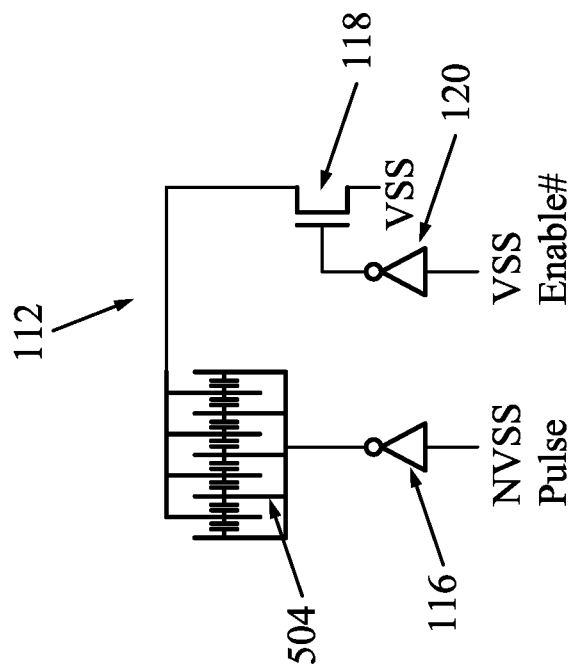
FIG. 5B is a diagram illustrating another example of a pull down circuit in accordance with some embodiments.
Figure 5A:
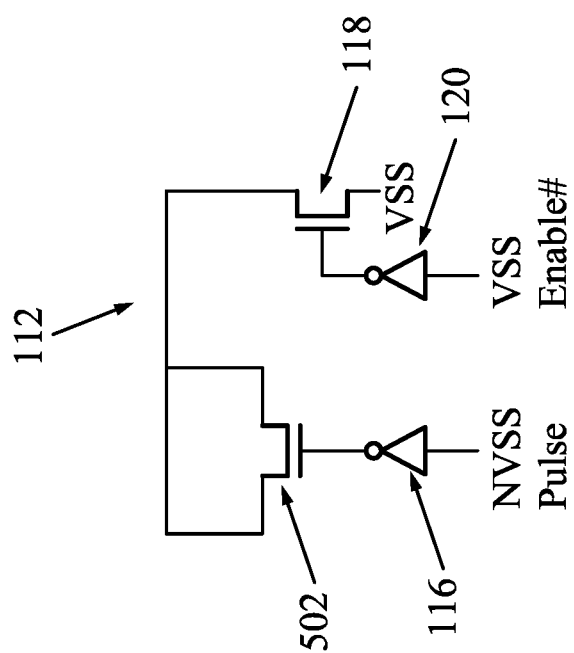
FIG. 5A is a diagram illustrating an example of a pull down circuit in accordance with some embodiments.

FIG. 5A illustrates a first example pull down circuit 112. Pull down circuit 112 of FIG. 5A includes a Metal Oxide Semiconductor Capacitor (MOSCAP) 502, pull down circuit first invertor 116, pull down circuit transistor 118, and pull down circuit second invertor 120. A first end of MOSCAP 502 is connectable to second node 106b of memory cell 102. A second end of MOSCAP 502 is connected to an output of pull down circuit first invertor 116. Pull down circuit first invertor 116 is operative to receive the NVSS pulse signal at its input. A source of pull down circuit transistor 118 is connectable to second node 106b and a drain of pull down circuit transistor 118 is connected to the ground. A gate of pull down circuit transistor 118 is connected to an output of pull down circuit second invertor 120. An input of pull down circuit second invertor 120 is operative to receive the enable signal or the VSS enable signal.

In example embodiments, MOSCAP 502 includes a Metal Oxide Semiconductor (MOS) transistor with its drain sorted with source forming the first end and a gate forming the second end. The MOS transistor of MOSCAP may be an nMOS transistor, a MOSFET, a pMOS transistor, or a CMOS transistor.

Pull down circuit 112 of FIG. 5A is operative to pull down a voltage of the ground voltage node of memory cell 102 of memory device 100 to a negative value during a read/write operation through discharging of MOSCAP 502. For example, during a read/write operation, both the NVSS signal and the VSS signal are charged to a logic high. This causes disconnecting of the ground voltage node from the ground and pulling down the voltage level of the ground voltage by MOSCAP 502 to a negative value.

FIG. 5B illustrates a second example pull down circuit 112. Pull down circuit 112 of FIG. 5B includes a coupling capacitor 504, pull down circuit first invertor 116, pull down circuit transistor 118, and pull down circuit second invertor 120. A first end of coupling capacitor 504 is connectable to second node 106b of memory cell 102. A second end of coupling capacitor 504 is connected to an output of pull down circuit first invertor 116. Pull down circuit first invertor 116 is operative to receive the NVSS pulse signal at its input. A source of pull down circuit transistor 118 is connectable to second node 106b and a drain of pull down circuit transistor 118 is connected to the ground. A gate of pull down circuit transistor 118 is connected to an output of pull down circuit second invertor 120. An input of pull down circuit second invertor 120 is operative to receive the enable signal or the VSS enable signal.

In example embodiments, coupling capacitor 504 includes a plurality of metal wires or metal plates arranged parallel to each other creating a coupling capacitor 504. In some examples, the plurality of metal wires or metal plates of coupling capacitor 504 are formed in a same metal layer or different metal layers. For example, a first portion of the plurality of metal wires or metal plates are formed in a first metal layer and a second portion of the plurality of metal wires or metal plates are formed in a second metal layer different from the first metal layer. In some other examples, the plurality of metal wires or metal plates may be formed in more than two metal layers.

Pull down circuit 112 of FIG. 5B is operative to pull down a voltage of the ground voltage node of memory cell 102 of memory device 100 to a negative value during a read/write operation through discharging of coupling capacitor 504. For example, during a read/write operation, both the NVSS signal and the VSS signal are charged to a logic high. This causes disconnecting of the ground voltage node from the ground and pulling down the voltage level of the ground voltage by coupling capacitor 504 to a negative value.

Figure 5D:
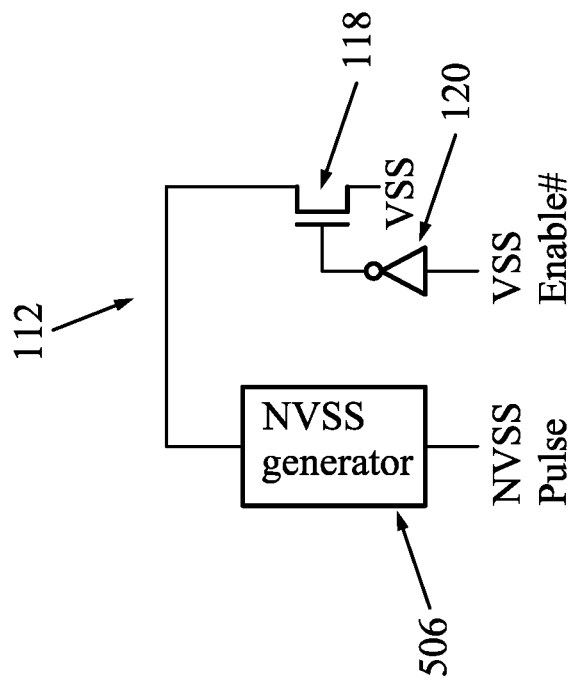
FIG. 5D is a diagram illustrating yet another example of a pull down circuit in accordance with some embodiments.
Figure 5C:
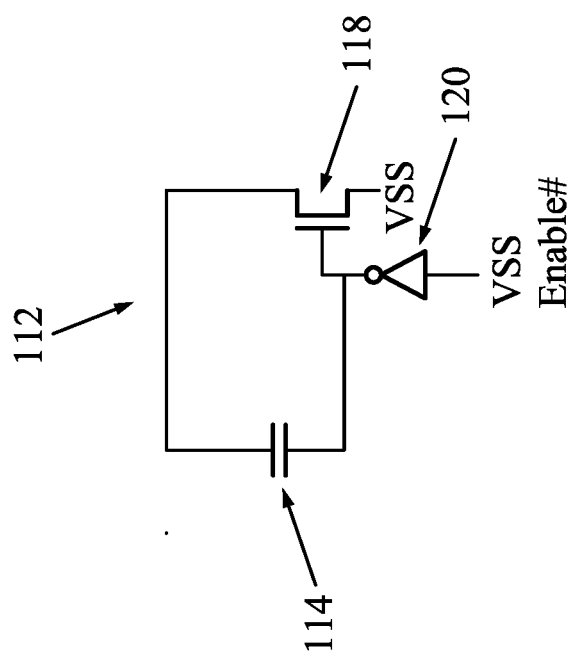
FIG. 5C is a diagram illustrating yet another example of a pull down circuit in accordance with some embodiments.

FIG. 5C illustrates a third example pull down circuit 112. Pull down circuit 112 of FIG. 5C includes pull down circuit capacitor 114, pull down circuit transistor 118, and pull down circuit second invertor 120. A first end of pull down circuit capacitor 114 is connectable to second node 106b of memory cell 102. A second end of pull down circuit capacitor 114 is connected to an output of pull down circuit second invertor 120. A source of pull down circuit transistor 118 is connectable to second node 106b and a drain of pull down circuit transistor 118 is connected to the ground. A gate of pull down circuit transistor 118 is connected to an output of pull down circuit second invertor 120. An input of pull down circuit second invertor 120 is operative to receive the enable signal or the VSS enable signal. Pull down circuit capacitor 114 can be a n-MOSCAP, a pMOSCAP, both n-MOSCAP and p-MOSCAP, or a coupling capacitor having multiple metal wires or plates placed formed parallel to each other.

Pull down circuit 112 of FIG. 5C is operative to pull down a voltage of the ground voltage node of memory cell 102 of memory device 100 to a negative value during a read/write operation through discharging of pull down circuit capacitor 114. For example, during a read/write operation, both the NVSS signal and the VSS signal are charged to a logic high. This causes disconnecting of the ground voltage node from the ground and pulling down the voltage level of the ground voltage by pull down circuit capacitor 114 to a negative value.

FIG. 5D illustrates a fourth example pull down circuit 112. Pull down circuit 112 of FIG. 5D includes a NVSS generator 506, pull down circuit transistor 118, and pull down circuit second invertor 120. A first end of NVSS generator 506 is connectable to second node 106b of memory cell 102. A second end of NVSS generator 506 is operative to receive the NVSS pulse signal. A source of pull down circuit transistor 118 is connectable to second node 106b and a drain of pull down circuit transistor 118 is connected to the ground. A gate of pull down circuit transistor 118 is connected to an output of pull down circuit second invertor 120. An input of pull down circuit second invertor 120 is operative to receive the enable signal or the VSS enable signal.

Pull down circuit 112 of FIG. 5D is operative to pull down a voltage of the ground voltage node of memory cell 102 of memory device 100 to a negative value during a read/write operation through discharging of NVSS generator 506. For example, during a read/write operation, both the NVSS signal and the VSS signal are charged to a logic high. This causes disconnecting of the ground voltage node from the ground and pulling down the voltage level of the ground voltage by NVSS generator 506 to a negative value.

Figure 6:
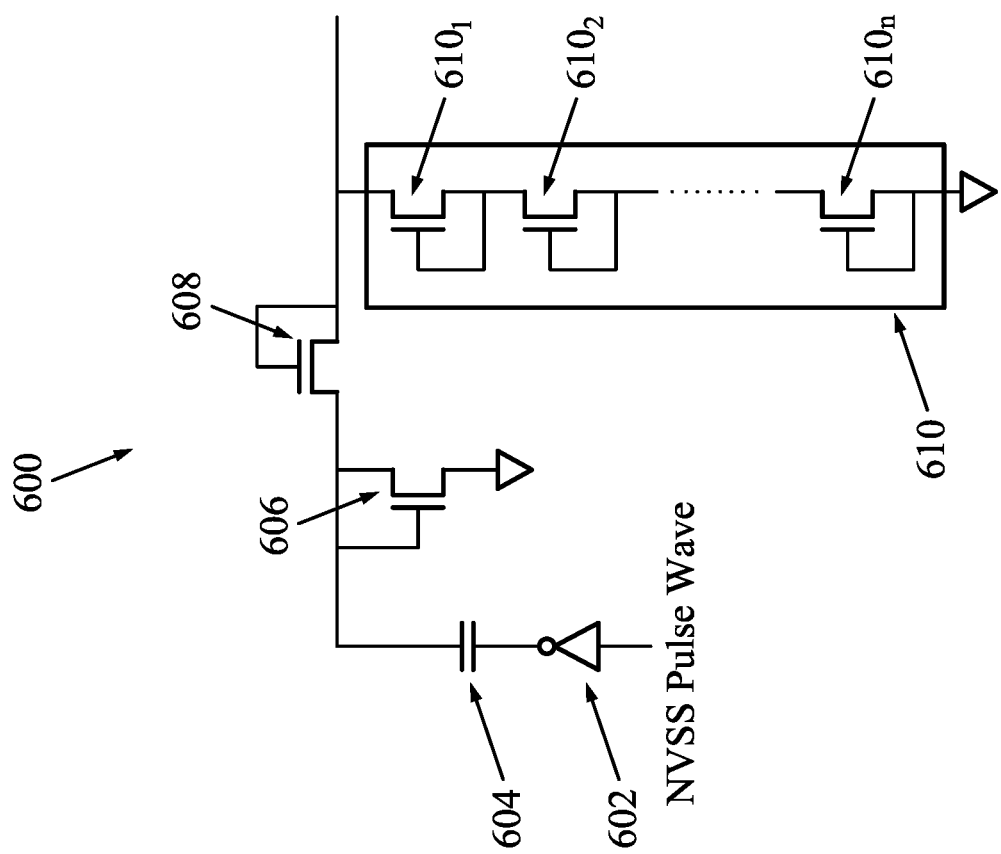
FIG. 6 is a diagram illustrating an example of a charge pump in accordance with some embodiments.

In example embodiments, NVSS generator 506 is a charge pump operative to, when activated, pump a negative charge to a ground voltage node thereby pulling down the voltage of the ground voltage node. FIG. 6 illustrates an example charge pump circuit 600 in accordance with some embodiments.

Charge pump circuit 600 includes a charge pump first invertor 602, a charge pump capacitor 604, a charge pump second diode 606, a charge pump third diode 608, and a charge pump diode chain 610. Charge pump diode chain 610 includes a plurality of diodes, for example, charge pump diode chain first diode $610_1$, charge pump diode chain second diode $610_2$, . . . , and charge pump diode chain $n^{th}$ diode $610_n$ connected together forming a chain. Charge pump diode chain 610 is formed by connecting a second end of one member diode with a first end of another member diode. For example, a second end of charge pump diode chain first diode $610_1$ is connected to a first end of charge pump diode chain first diode $610_2$. A first end of a first member diode forms a first end of charge pump diode chain 610 and a second end of a last member diode forms a second end of charge pump diode chain 610. A number of member diode for charge pump diode chain 610 is configurable and may depend an amount of charge to be pumped by charge pump 600.

Charge pump first invertor 602 is operable to receive the NVSS pulse at its input. An output of charge pump first invertor 602 is connected to a first end of charge pump capacitor 604. A second end of charge pump capacitor 604 is connected to a first end of charge pump second diode 606. A second end of charge pump second diode 606 is connected to the ground. The first end of charge pump second diode 606 is connected to a first end of charge pump third diode 608. A second end of charge pump third diode 608 is connectable to the ground voltage node. A first end of charge pump diode chain 610 is connected to the ground voltage node and a second end of charge pump diode chain 610 is connected to the ground.

During operation, when the NVSS pulse signal rises to a logic high (that is, when the NVSS pulse is injected), into charge pump first invertor 602, charge pump capacitor 604, charge pump second diode 606, charge pump third diode 608, and charge pump diode chain 610 which pulls down the voltage of the ground voltage node to a negative value.

Figure 7:
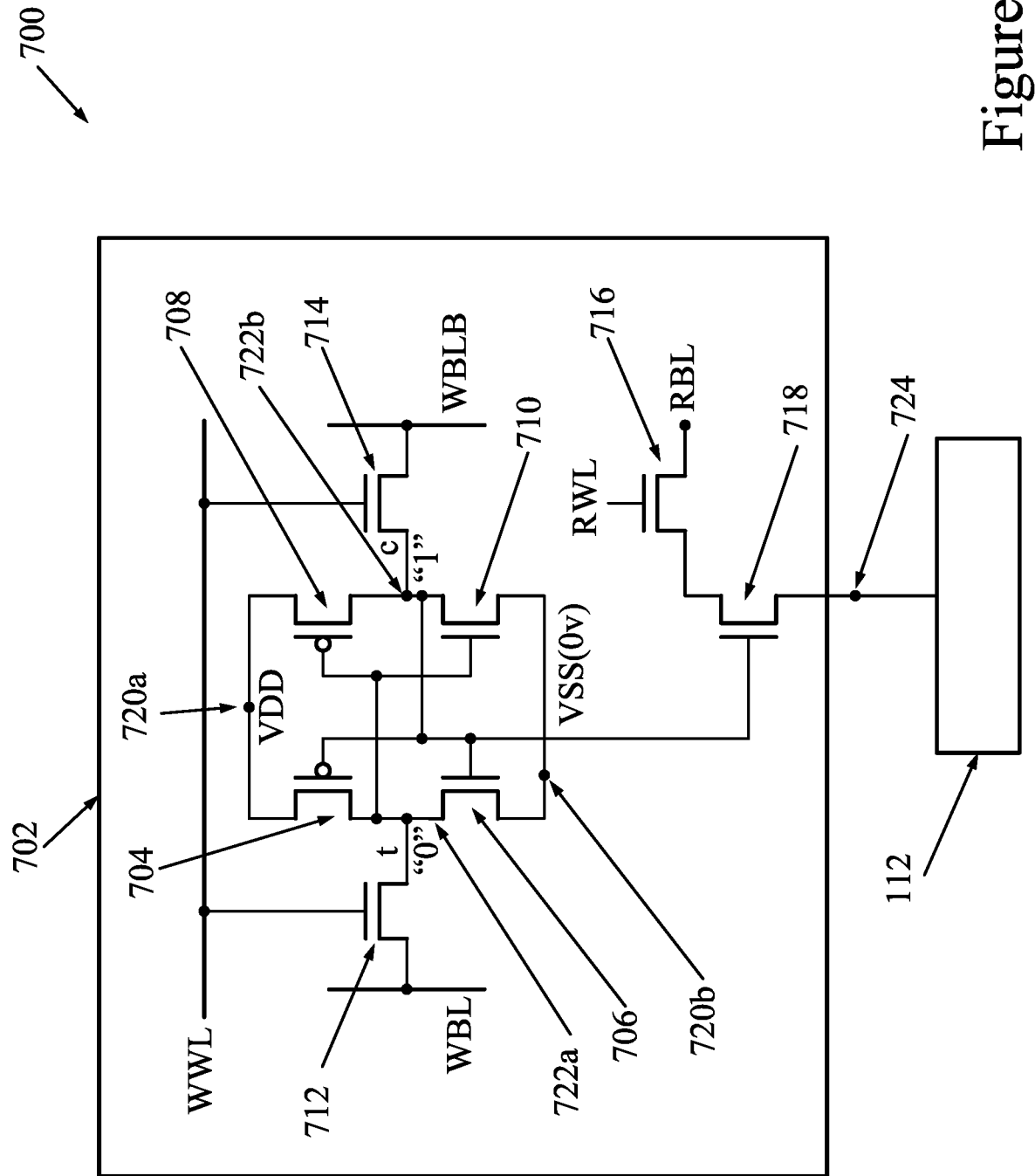
FIG. 7 is a diagram illustrating an example of an 8T memory device in accordance with some embodiments.

In example embodiments, pull down circuit 112 may be connected to an Eight Transistor (8T) SRAM. FIG. 7 illustrates a memory device 700 having a 8T memory cell. As shown in FIG. 7, memory device 700 includes a 8T memory cell 702 and pull down circuit 112 connected to a ground voltage node of memory cell 702.

8T memory cell 702 includes eight transistors, that is, a first transistor 704, a second transistor 706, a third transistor 708, a fourth transistor 710, a fifth transistor 712, a sixth transistor 714, a seventh transistor 716, and an eighth transistor 718. A source of first transistor 704 is connected to a first node 720a and a drain of first transistor 704 is connected to a first data node 722a. A source of second transistor 706 is connected to first data node 722a and a drain of second transistor 706 is connected to a second node 720b. A gate of first transistor 704 is connected to a gate of second transistor 706. First node 720a is also referred to as a VDD node or a supply node and second node 720b is also referred to as a VSS node or the ground voltage node. First transistor 704 and second transistor 706 form a first invertor. First data node 722a is operative to store one bit of information (that is, a bit value of "0" or "1").

A source of third transistor 708 is connected to first node 720a and a drain of third transistor 708 is connected to a second data node 722b. A source of fourth transistor 710 is connected to second data node 722b and a drain of fourth transistor 710 is connected to second node 720b. A gate of third transistor 708 is connected to a gate of fourth transistor 710. Third transistor 708 and fourth transistor 710 form a second invertor. The second invertor is cross coupled with the first invertor at first data node 722a and second data node 722b.

A source of fifth transistor 712 is connected to a Write Bit Line (WBL) and a drain of fifth transistor 712 is connected to first data node 722a. A gate of fifth transistor 712 is connected to Write Word Line (WWL). A source of sixth transistor 714 is connected to a Write Bit Line Bar (WBLB) and a drain of sixth transistor 714 is connected to second data node 722b. A gate of sixth transistor 714 is connected to Write Word Line (WWL).

A drain of seventh transistor 716 is connected to a Read Bit Line (RBL) and a source of seventh transistor 716 is connected to a drain of eight transistor 718. A gate of seventh transistor 716 is connected to a Read Word Line (RWL). A gate of eighth transistor 718 is connected to second data node 722b. A source of eighth transistor 718 is connected to ground voltage node 724. Pull down circuit 112 is also connected to ground voltage node 724. During a read operation of memory cell 702, pull down circuit 112 is operative to pull the voltage of ground voltage node 724 to a negative voltage.

In example embodiments, each of first transistor 704, second transistor 706, third transistor 708, fourth transistor 710, fifth transistor 712, sixth transistor 714, seventh transistor 716, and eighth transistor 718 are symmetrical. In addition each of first transistor 704, second transistor 706, third transistor 708, fourth transistor 710, fifth transistor 712, sixth transistor 714, seventh transistor 716, and eighth transistor 718 may include an nMOS transistor, a pMOS transistor, CMOS transistor, or a MOSFET.

Memory cell 702 is also referred to as a dual port memory cell or a multi-port memory cell as it includes a read port and a write port. In example embodiments, another pull down circuit 112 can be connected to second node 720b which can pull down the voltage of second node 720b to a negative voltage during a write operation on memory cell 702. In some other examples, pull down circuit 112 can be connected to both second node 720b and ground voltage node 724 and may pull down the voltage of second node 720 to a negative voltage during a write operation and pull down the voltage of ground voltage node 724 to a negative voltage during a read operation. In examples, although FIG. 7 illustrates a dual port memory cell, the techniques disclosed herein can be applied to multi read/write ports memory cells. In such examples, read ports can be connected to either first data node 722a or second data node 722b, and write ports can be added by pair of nMOS devices attached to both first data node 722a and second data node 722b and connecting to WBL[i]/WBLB[i] respectively, where i is integer.

Figure 8:
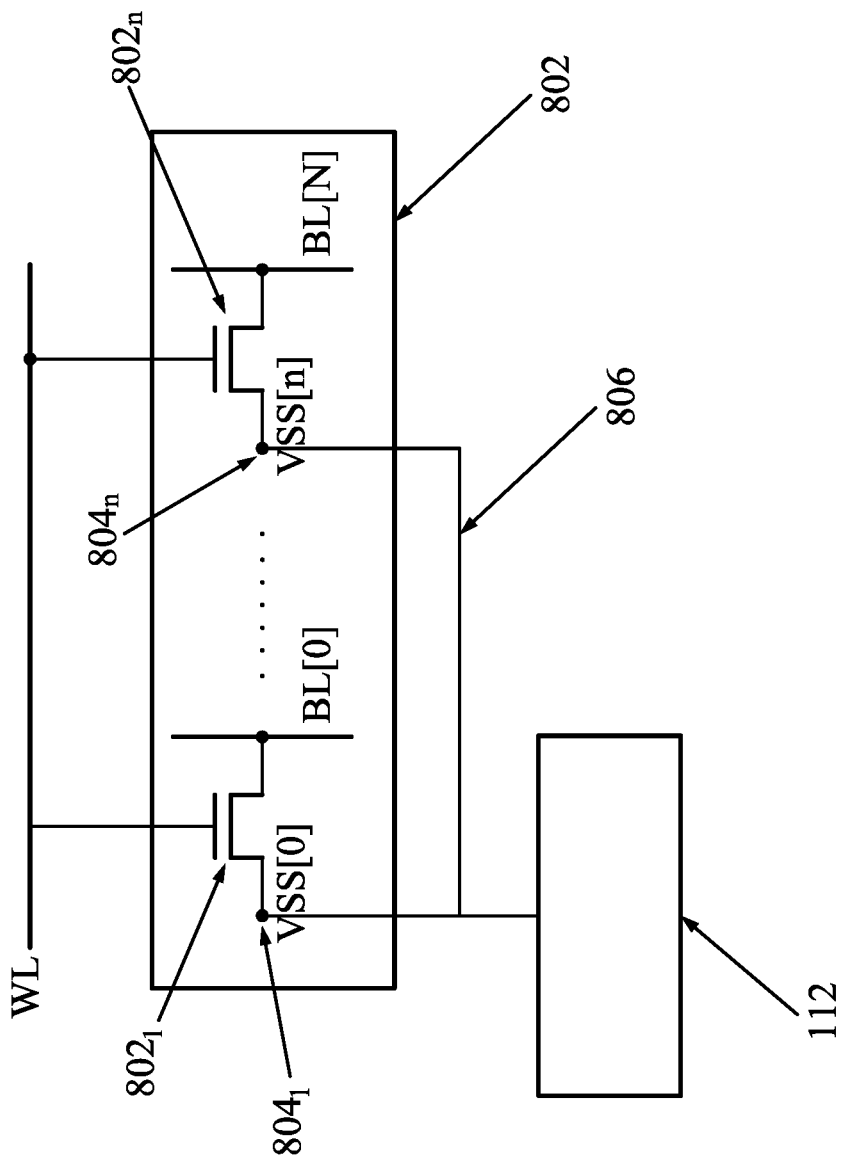
FIG. 8 is a diagram illustrating an example of a Read Only Memory (ROM) device in accordance with some embodiments.

In example embodiments, pull down circuit 112 may be connected to a Read Only Memory and a Content Addressable Memory. FIG. 8 illustrates ROM memory device 800 having a plurality of ROM memory cells 802, that is, a first ROM memory cell $802_1$, . . . , an $n^{th}$ ROM memory cell $802_1$. A gate of each of plurality of ROM memory cells 802 is connected to a WL. A source of each of plurality of ROM memory cells 802 is connected to a corresponding bit line. For example, and as shown in FIG. 8, a source of first ROM memory cell $802_1$ is connected to a first Bit Line (that is, BL[0]), continuing to $n^{th}$ ROM memory cell $802_n$ for which the source is connected to a $n^{th}$ Bit Line (that is, BL[N]). A drain of each of plurality of ROM memory cells 802 is connected to a corresponding ground voltage node. For example, and as shown in FIG. 8, a drain of first ROM memory cell $802_1$ is connected to a first ground voltage node $804_1$, continuing to $n^{th}$ ROM memory cell $802_n$ for which the drain is connected to a $n^{th}$ ground voltage node $804_n$. In addition, each of the plurality of ground voltage nodes (that is first ground voltage node $804_1, \ldots, n^{th}$ ground voltage node $804_n$) is connected to pull down circuit 112. In example embodiment, the plurality of ground voltage nodes of ROM memory device 800 are connected to pull down circuit 112 via a pull down line 806. Pull down line 806 is formed parallel to the WL. Pull down line 806 is formed in a same metal layer as of the WL or in a different metal layer.

Figure 9:
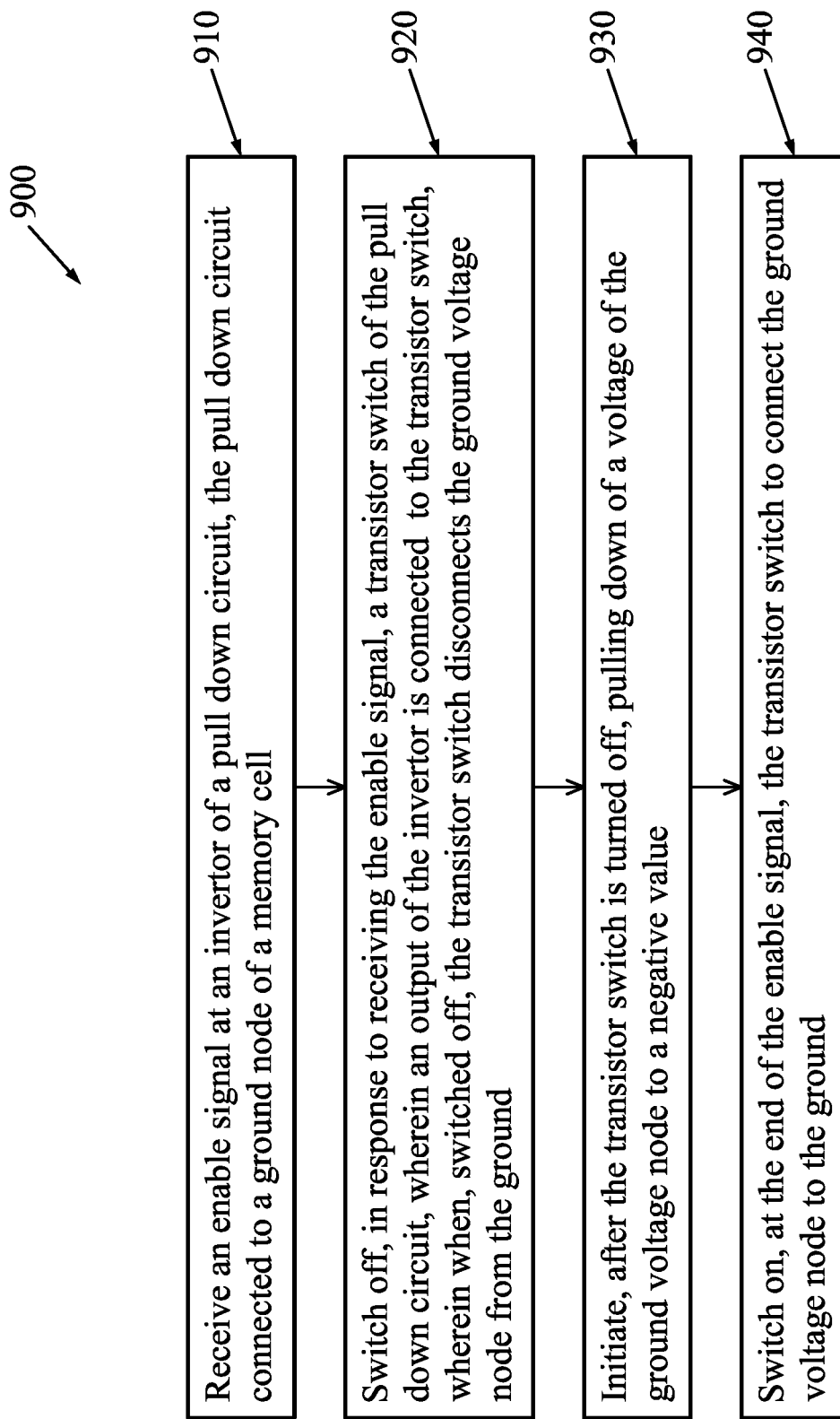
FIG. 9 is a flow diagram illustrating a method for operating a memory device in accordance with some embodiments.

FIG. 9 is a flow diagram illustrating a method 900 for operating a memory device, in accordance with some embodiments. For example, FIG. 9 is a flow diagram illustrating method 900 for operating any of memory device 100, memory device 300, memory device 400, memory device 700, and memory device 800 as described above with reference to FIGS. 1-8. Method 900 may be performed by a processor. In addition, method 900 may be stored as instructions on a memory device, which when executed by a processor can cause the processor to perform method 900.

At block 910 of method 900, an enable signal is received. The enable signal indicates a read operation or a write operation in a memory device 100, memory device 300, memory device 400, memory device 700, or memory device 800. The enable signal is received at pull down circuit second invertor 120 of pull down circuit 112 which is connected to the ground voltage node (that is, second node 106b) of memory cell 102.

At block 920 of method 900, a transistor switch of the pull down circuit is switched off in response to receiving the enable signal. For example, pull down circuit transistor 118 is switched off in response to receiving the enable signal at pull down circuit second invertor 120. An output of pull down circuit second invertor 120 is connected to the gate of pull down circuit transistor 118. Hence, pull down circuit transistor 118 is switched off when the output of pull down circuit second invertor 120 is at a logic low. When switched off, pull down circuit transistor 118 disconnects the ground voltage node (that is, second node 106b) of memory cell 102 from the ground.

At block 930 of method 900, pulling down of the voltage of the ground voltage node is initiated. For example, the negative voltage generator circuit pulls down the voltage of second node 106b to a negative value. In example embodiments, the negative voltage generator circuit pulls down the voltage of second node 106b to a negative VDD.

At block 940 of method 900, the transistor switch is switched on at the end of the enable signal to connected the ground voltage node to the ground. For example, pull down circuit transistor 118 is switched on in response to ending of the enable signal at pull down circuit second invertor 120. Switching on of pull down circuit transistor 118 results on connecting the ground voltage node (that is, second node 106b) to the ground.

In accordance with example embodiments, a memory device, comprises: a bit cell comprising: a first invertor connected between a first node and a second node, and a second invertor connected between the first node and the second node, wherein the first invertor and the second invertor are cross coupled at a first data node and a second data node; and a pull down circuit connected to the second node, wherein the pull down circuit is operative to pull down a voltage of the second node below a ground voltage in response to an enable signal.

In example embodiments, a pull down circuit comprises: a transistor switch connected between a ground voltage node of a memory cell and a ground node; an invertor connected to the transistor switch, wherein an input of the invertor is operative to receive an enable signal, wherein an output of the invertor is connected to a gate of the transistor switch; and a negative voltage generator circuit connected to the ground voltage node and a second end coupled to the gate of the transistor switch, wherein the negative voltage generator circuit is operative to drive a voltage of the ground voltage node to a negative value from the ground voltage in response to the enable signal.

In example embodiments, a method of pulling down a voltage of a ground node of a memory cell, the method comprises: receiving an enable signal at an invertor of a pull down circuit, the pull down circuit connected to a ground node of a memory cell; switching off, in response to receiving the enable signal, a transistor switch of the pull down circuit, wherein an output of the invertor is connected to the transistor switch, wherein when, switched off, the transistor switch disconnects the ground voltage node from the ground; initiating, after the transistor switch is turned off, pulling down of a voltage of the ground voltage node to a negative value; and switching on, at the end of the enable signal, the transistor switch to connect the ground voltage node to the ground.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a bit cell comprising a first node and a second node;
a transistor switch connected between the second node and a ground node, wherein a gate of the transistor switch receives an enable signal; and
a negative voltage generator circuit connected to the second node in parallel to the transistor switch, wherein the negative voltage generator circuit receives an inverted enable signal pulse and is operative to pull down a voltage of the second node below a ground voltage in response to receiving the inverted enable signal pulse, and wherein the enable signal is activated before a word line activation signal, the word line activation signal indicating a read operation or a write operation in the memory device.

2. The memory device of claim 1, further comprising:
a first invertor connected between the first node and the second node; and
a second invertor connected between the first node and the second node, wherein the first invertor and the second invertor are cross coupled at a first data node and a second data node.

3. The memory device of claim 1, wherein the negative voltage generator circuit comprises a capacitor connected to the second node, and wherein the capacitor is operative to pull down the voltage of the second node below the ground voltage in response to the enable signal.

4. The memory device of claim 3, wherein the capacitor comprises a Metal Oxide Semiconductor (MOS) capacitor.

5. The memory device of claim 3, wherein the capacitor comprises a plurality of metal plates substantially parallel to each other.

6. The memory device of claim 3, wherein the capacitor is isolated after the word line activation signal.

7. The memory device of claim 1, wherein the negative voltage generator circuit is shared by a plurality of bit cells.

8. A pull down circuit, comprising:
- a transistor switch connected between a ground voltage node of a memory cell and a ground node; and
- a negative voltage generator circuit connected to the ground voltage node in parallel with the transistor switch, wherein a first end of the negative voltage generator circuit is connected to the ground voltage node and a second end of the negative voltage generator circuit is operative to receive an inverted enable signal pulse, wherein the negative voltage generator circuit is operative to drive a voltage of the ground voltage node to a negative value from the ground voltage in response to receiving the inverted enable signal pulse, and wherein the enable signal is activated before a word line activation signal, the word line activation signal indicating a read operation or a write operation in the memory cell.

9. The pull-down circuit of claim 8, further comprising an invertor connected to a gate of the transistor switch, wherein an input of the invertor is operative to receive an enable signal, and wherein an output of the invertor is connected to the gate of the transistor switch.

10. The pull down circuit of claim 8, wherein the memory cell comprises a 6T Static Memory Random Access Memory (SRAM).

11. The pull down circuit of claim 8, wherein the memory cell comprises a 8T Static Memory Random Access Memory (SRAM).

12. The pull down circuit of claim 8, wherein the memory cell comprises a Read Only Memory (ROM).

13. The pull down circuit of claim 8, wherein the memory cell comprises a Content Addressable Memory (CAM).

14. The pull down circuit of claim 8, wherein the memory cell comprises a multi-port Static Memory Random Access Memory (SRAM).

15. The pull down circuit of claim 8, wherein the negative voltage generator circuit comprises a capacitor.

16. A method of pulling down a voltage of a ground node of a memory cell, the method comprising:
- switching off, in response to receiving an enable signal, a transistor switch connected between a ground voltage node of a memory cell and a ground node, wherein the transistor switch, when switched off, disconnects the ground voltage node from the ground;
- pulling down, after switching off the transistor switch, a voltage of the ground voltage node to a negative value through a negative voltage generator circuit connected in parallel to the transistor switch, wherein the negative voltage generator circuit receives an inverted enable signal pulse and is operative to pull down the voltage of the second node below the ground voltage in response to receiving the inverted enable signal pulse, wherein an enable signal is activated before a word line activation signal, the word line activation signal indicating a read operation or a write operation on the memory cell; and
- switching on, at the end of the inverted enable signal pulse, the transistor switch to connect the ground voltage node to the ground.

17. The method of claim 16, wherein pulling down the voltage of the ground voltage node comprises initiating charging of a capacitor connected to the ground voltage node, wherein charging of the capacitor pulls down the voltage of the ground voltage node.

18. The method of claim 16, wherein the memory cell comprises a 8T Static Memory Random Access Memory (SRAM).

19. The method of claim 16, wherein the memory cell comprises a Read Only Memory (ROM).

20. The method of claim 16, wherein the memory cell comprises a Content Addressable Memory (CAM).

* * * * *